United States Patent
Fiolka et al.

(10) Patent No.: US 8,964,162 B2
(45) Date of Patent: Feb. 24, 2015

(54) OPTICAL ASSEMBLY

(75) Inventors: Damian Fiolka, Oberkochen (DE); Wilfried Clauss, Tuebingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 635 days.

(21) Appl. No.: 13/235,750

(22) Filed: Sep. 19, 2011

(65) Prior Publication Data

US 2012/0019799 A1 Jan. 26, 2012

Related U.S. Application Data

(63) Continuation of application No. PCT/EP2010/001604, filed on Mar. 13, 2010.

(60) Provisional application No. 61/163,929, filed on Mar. 27, 2009.

(30) Foreign Application Priority Data

Mar. 27, 2009 (DE) .................. 10 2009 014 701

(51) Int. Cl.
*G03F 7/20* (2006.01)
*G02B 17/08* (2006.01)
*G02B 26/08* (2006.01)

(52) U.S. Cl.
CPC ........ *G03F 7/70891* (2013.01); *G02B 17/0892* (2013.01); *G02B 26/0816* (2013.01)
USPC .................. 355/30; 355/53; 355/55; 355/67; 359/871

(58) Field of Classification Search
CPC .... G02B 17/0892; G02B 7/028; G02B 7/181; G02B 7/1815; G02B 26/0816; G03F 7/70825; G03F 7/70833; G03F 7/70891

USPC .......... 355/30, 53, 67, 77; 359/811, 819, 820, 359/845, 871
See application file for complete search history.

(56) References Cited

U.S. PATENT DOCUMENTS 6,316,150 B1 * 11/2001 Gianoulakis et al. ............. 430/5
6,768,600 B2    7/2004 Dieker
(Continued)

FOREIGN PATENT DOCUMENTS

DE     100 50 125 A1    4/2002
EP     1 197 776 A2     4/2002
(Continued)

OTHER PUBLICATIONS

Chinese Office Action, with English translation, for corresponding CN Appl No. 2010 8001 4776.8, dated Nov. 4, 2013.
(Continued)

*Primary Examiner* — Steven H Whitesell Gordon
(74) *Attorney, Agent, or Firm* — Fish & Richardson P.C.

(57) ABSTRACT

An optical assembly has at least one mirror with a mirror body. The latter is carried by a support body, which has a first support body portion and a second support body portion. An at least thermally separating region is arranged between the two support body portions. At least one surface portion of at least one of the support body portions or of a body thermally coupled thereto is modified in such a way that a thermal emission coefficient $\epsilon_m$ of the modified surface portion differs from a thermal emission coefficient $\epsilon_u$ of the unmodified surface portion by at least 10%. The result is an optical assembly, in which an improved thermal stability is achieved by the predetermining of the thermal emission coefficients.

42 Claims, 6 Drawing Sheets

(56) References Cited

U.S. PATENT DOCUMENTS

| | | | |
|---|---|---|---|
| 7,015,489 B2 | 3/2006 | Singer et al. | |
| 7,068,348 B2 | 6/2006 | Hara | |
| 7,158,209 B2 | 1/2007 | Hara | |
| 7,360,366 B2* | 4/2008 | Namba | 62/3.7 |
| 2002/0074115 A1* | 6/2002 | Dieker | 165/201 |
| 2003/0043455 A1 | 3/2003 | Singer et al. | |
| 2004/0051984 A1* | 3/2004 | Oshino et al. | 359/845 |
| 2004/0092844 A1 | 5/2004 | Johnson et al. | |
| 2004/0094724 A1* | 5/2004 | Schuurmans et al. | 250/492.2 |
| 2004/0227913 A1* | 11/2004 | Kino | 355/30 |
| 2004/0227914 A1* | 11/2004 | Hara | 355/30 |
| 2004/0228012 A1* | 11/2004 | Sakamoto | 359/820 |
| 2004/0262541 A1* | 12/2004 | Honda et al. | 250/492.2 |
| 2005/0018154 A1* | 1/2005 | Box et al. | 355/30 |
| 2005/0030653 A1* | 2/2005 | Holderer et al. | 359/872 |
| 2005/0030656 A1* | 2/2005 | Holderer et al. | 359/879 |
| 2005/0111067 A1 | 5/2005 | Seifert et al. | |
| 2006/0132747 A1 | 6/2006 | Singer et al. | |

FOREIGN PATENT DOCUMENTS

| | | |
|---|---|---|
| EP | 1 225 481 A | 7/2002 |
| EP | 1 376 239 A2 | 1/2004 |
| EP | 1 472 562 B1 | 11/2004 |
| EP | 1 477 850 A1 | 11/2004 |
| EP | 1 477 853 A2 | 11/2007 |
| JP | H 01-130572 A | 5/1989 |
| JP | 2002-198305 A | 7/2002 |
| JP | 2004-029314 A | 1/2004 |
| JP | 2004-343116 A | 12/2004 |
| JP | 2004-363559 A | 12/2004 |
| JP | 2005-517291 A | 6/2005 |
| WO | WO 03/067304 | 8/2003 |
| WO | WO 2005/015314 A2 | 2/2005 |

OTHER PUBLICATIONS

Japanese office action, with English translation thereof, for JP Appl No. 2012-501162, dated Feb. 4, 2014.
Chinese office action, with English translation thereof, for CN Appl No. 2010 8001 4776.9, dated Jul. 3, 2014.
Chinese office action with English translation with respect to Chinese patent application No. 2010 8001 4776.9, dated Jan. 14, 2013.
Korean office action with English translation with respect to Korean patent application No. 10-2011-7022509, dated Dec. 20, 2012.
The International Search Report for the corresponding PCT Application No. PCT/EP2010/001604, mailed Jul. 1, 2010.
German Office Action, with English translation, for corresponding DE Appl No. 10 2009 014 701.2, dated Aug. 3, 2009.

* cited by examiner

OPTICAL ASSEMBLY

CROSS-REFERENCE TO RELATED APPLICATIONS

This application is a continuation of, and claims benefit under 35 USC 120 to, international application PCT/EP2010/001604, filed Mar. 13, 2010, which claims priority under 35 U.S.C. 119(e)(1) to U.S. Provisional Application No. 61/163,929, filed on Mar. 27, 2009. PCT/EP2010/001604 also claims benefit of German Patent Application, Serial No. 10 2009 014 701.2, filed on Mar. 27, 2009, pursuant to 35 U.S.C. 119. The entire contents of international application PCT/EP2010/001604 are hereby incorporated herein by reference in their entirety.

FIELD

The disclosure relates to an optical assembly, in particular for use in a projection exposure installation for microlithography, for example for EUV microlithography. Furthermore, the disclosure relates to an illumination optics and a projection optics, in which the optical assembly is used. Furthermore, the disclosure relates to a projection exposure installation with an optical assembly of this type, a production method for a microstructured or nanostructured component and a component produced by a method of this type.

BACKGROUND

An optical assembly with a mirror body and a support body is known from US 2005/0111067 A1, DE 100 50 125 A1, US 2004/0228012 A1, U.S. Pat. No. 7,158,209 B2 and U.S. Pat. No. 7,068,348 B2.

SUMMARY

The disclosure provides an optical assembly in particular for use in a projection exposure installation for microlithography, for example for EUV microlithography, which exhibits improved thermal stability.

In one aspect, the disclosure provides an optical assembly with at least one mirror with a mirror body
which is carried by a support body, which has
  a first support body portion,
  a second support body portion,
  wherein an at least partially thermally separating region is arranged between the two support body portions,
  wherein at least one surface portion of at least one of the support body portions or of a body thermally coupled thereto is locally modified in such a way that a thermal emission coefficient $\epsilon_m$ of the modified surface portion differs from a thermal emission coefficient $\epsilon_u$ of the unmodified surface portion by at least 10 percent.

It was recognised according to the disclosure that, by modifying at least one surface portion of one of the support body portions, the possibility is provided of influencing a temperature difference between the two support body portions. This temperature difference may be minimised, in particular, so that, for example, a thermally induced "bimetal effect" cannot occur. This bimetal effect can occur when the mirror body is in contact with the first support body portion and the second support body portion via a mechanical heat bridge. As a result, the possibility results of providing an optical assembly which is thermally improved with regard to its stability by modifying the at least one surface portion. The difference between the thermal emission coefficient $\epsilon_m$ of the modified surface portion and the thermal emission coefficient $\epsilon_u$ of the unmodified surface portion may be greater than 10%, may also be greater than 20%, may be greater than 50% and may be greater than 100%. The ratio between the two emission coefficients may be greater than a factor of 2, may be greater than a factor of 5, may be greater than a factor of 8, may be greater than a factor of 10 and may even be greater than a factor of 15. The at least partially thermally separating region between the two support body portions may be a layer of a material partially or completely insulating the two support body portions thermally from one another. The at least partially thermally separating region may also be an evacuated volume between the two support body portions, it being possible for the two support body portions to be mechanically connected to one another at separate locations. The entire optical assembly or components thereof may be accommodated in at least one chamber which can be evacuated. At least one mirror of the optical assembly may be as a facet mirror with a plurality of facets predetermining illumination channels. The optical assembly may have precisely one facet mirror of this type. The emission coefficient of the modified surface portion differs by at least 10% from the thermal emission coefficient of the unmodified surface portion. This means that by modifying one and the same surface portion, this difference of the thermal emission coefficient is brought about by at least 10%. The at least one modified surface portion may be a surface portion of an actuator component for displacing the mirror body of the optical assembly.

A processed surface portion can be produced by known processing and in particular by material processing methods, so depending on the processing, a predetermined modified thermal emission coefficient $\epsilon_m$ can be finely adjusted.

Microstructures can lead to an increase in the modified thermal emission coefficient $\epsilon_m$ in comparison to the unmodified thermal emission coefficient $\epsilon_u$, as the surface of the processed surface portion is increased. Microstructures are structures with typical dimensions in the range of micrometers, for example in the range of between 0.5 and 100 micrometers. Saw tooth structures, trough structures or microribs may be used as microstructures. In this case, these structures may be arranged spatially periodically. It is, however, possible for the microstructures to be arranged irregularly, i.e. with a statistically varying spacing from one another, wherein, for example, the spacing of adjacent structures may follow a predetermined distribution, which optionally additionally has a direction orientation.

Diffractive structures may lead to an additional reflection efficiency, in particular in wavelengths acting on the mirror, which would otherwise lead to a large heat loading of the mirror. In particular, the diffractive structures may be designed for IR-(infrared) wavelengths.

Nanostructures can lead to a particularly advantageous enlargement of the surface of the processed surface portion and correspondingly to an enlargement of the modified thermal emission coefficient. Nanostructures are structures with typical dimensions in the range of nanometers, for example in the range between 30 and 500 nanometers. In this case, these structures may be spatially arranged regularly with respect to one another. Alternatively, these structures may also be arranged irregularly, i.e. with a statistically varying spacing from one another, wherein, for example, the spacing of adjacent structures may follow a predetermined distribution, which optionally additionally has a direction orientation.

Notches or holes, in particular blind holes may be configured in the processed surface portion as an mm- or cm-structure.

A surface layer may selectively be used to increase or reduce the thermal emission coefficient of the processed surface portion. An oxide layer, a varnish, an extraneous substance coating, a glass coating or a metal layer, for example a chromium layer, may be used as the surface layer. The surface layer may differ with respect to its chemical composition from a material covered by the surface layer.

A displaceable covering body can allow a variable thermal emission coefficient $\epsilon_m$ of the modified surface portion to be predetermined. An adaptation is then possible to the respective heat transmission conditions of the mirror of the optical assembly by a corresponding displacement of the covering body relative to the associated support body portion.

The thermal emission coefficient of the covering body can be predetermined by a modified, in particular processed surface portion.

Modified surface portions of the two support body portions can increase the number of degrees of freedom to predetermine a thermally stable optical assembly.

An arrangement with various modified emission coefficients $\epsilon_m$ can have corresponding advantages.

A radiation body can lead to a further enlargement of the number of degrees of freedom for predetermining a thermally stable optical assembly. The thermal radiation body may be used for cooling or heating. A radiation source for illuminating the optical assembly may be used as the thermal radiation body. In this case, radiation deviating from the useful radiation used for illumination with respect to its wavelength can be used as the thermal radiation.

A radiation body with a modified, in particular with a processed surface portion can be adjusted with regard to its thermal emission coefficient.

The advantages of the at least one modified surface portion particularly can come to the fore in certain mirror body arrangements.

The temperature difference between the temperatures of the two mirror bodies can be predetermined in an arrangement by the adjustment of the thermal emission coefficients of the support body portions.

A blind hole or pocket structure according to claim 16 offers a further degree of freedom for predetermining a thermally stable optical assembly.

A pocket structure can allow the adjustment of a predetermined thermal emission of the blind hole or pocket structure.

The same can apply to a radiation body.

An active temperature control device, in particular an active cooling device, can represent a further degree of freedom for predetermining a thermally stable optical assembly.

Configurations have proven successful in practice for the active temperature control device.

A coating can be adapted to the respective operating temperature of the optical assembly. The coating may, in particular, be designed as an anti-reflex-interference coating. In addition, the coating may have an absorbing metal layer, for example a chromium layer. The coating ensures that the heat radiation is highly efficiently discharged from the body carrying modified surface portion at the operating temperature.

A modified surface portion can in particular allow a targeted discharge of emitted heat radiation. The modification may in particular be such that a preferred direction of the thermal emission on to another body of the optical assembly occurs, by which an efficient heat discharge can then take place. The anisotropy of the thermal emission can also be used to keep the heat radiation away from sensitive components of the optical assembly or their surroundings as far as possible.

In some optical assemblies, the at least one modified surface portion may be provided in particular on a rear side of the mirror body remote from the reflection useful surface. The heat radiation from the mirror body via the mirror rear side is then accordingly optimised. All modification variants may be used for the modified surface portion, which were discussed above in connection with the modified support body surface portion. In particular, an interference coating or a micro- or nanostructuring, as discussed above, may be used for the modified surface portion of the mirror body.

The advantages of an illumination optics, a projection optics, a projection exposure installation, a production method, and a microstructured or nanostructured component can correspond to those which were already described above with reference to the optical assembly. The illumination optics may be an EUV illumination optics. The projection optics may be an EUV projection optics. The projection exposure installation may be an EUV projection exposure installation with an EUV radiation source. The illumination optics may have precisely one facet mirror, wherein this facet mirror may be designed as a specular reflector, as known from WO 2004/092844 A2 and from US 2006/0132747 A1. The illumination optics in a further variant may have precisely two facet mirrors, namely a field facet mirror and a pupil facet mirror. The illumination optics may, in total, be constructed with one, with two, with three, with four or with a larger number of mirrors.

BRIEF DESCRIPTION OF THE DRAWINGS

Embodiments of the disclosure will be described in more detail below with the aid of the drawings, in which.

DETAILED DESCRIPTION

Figure 1:
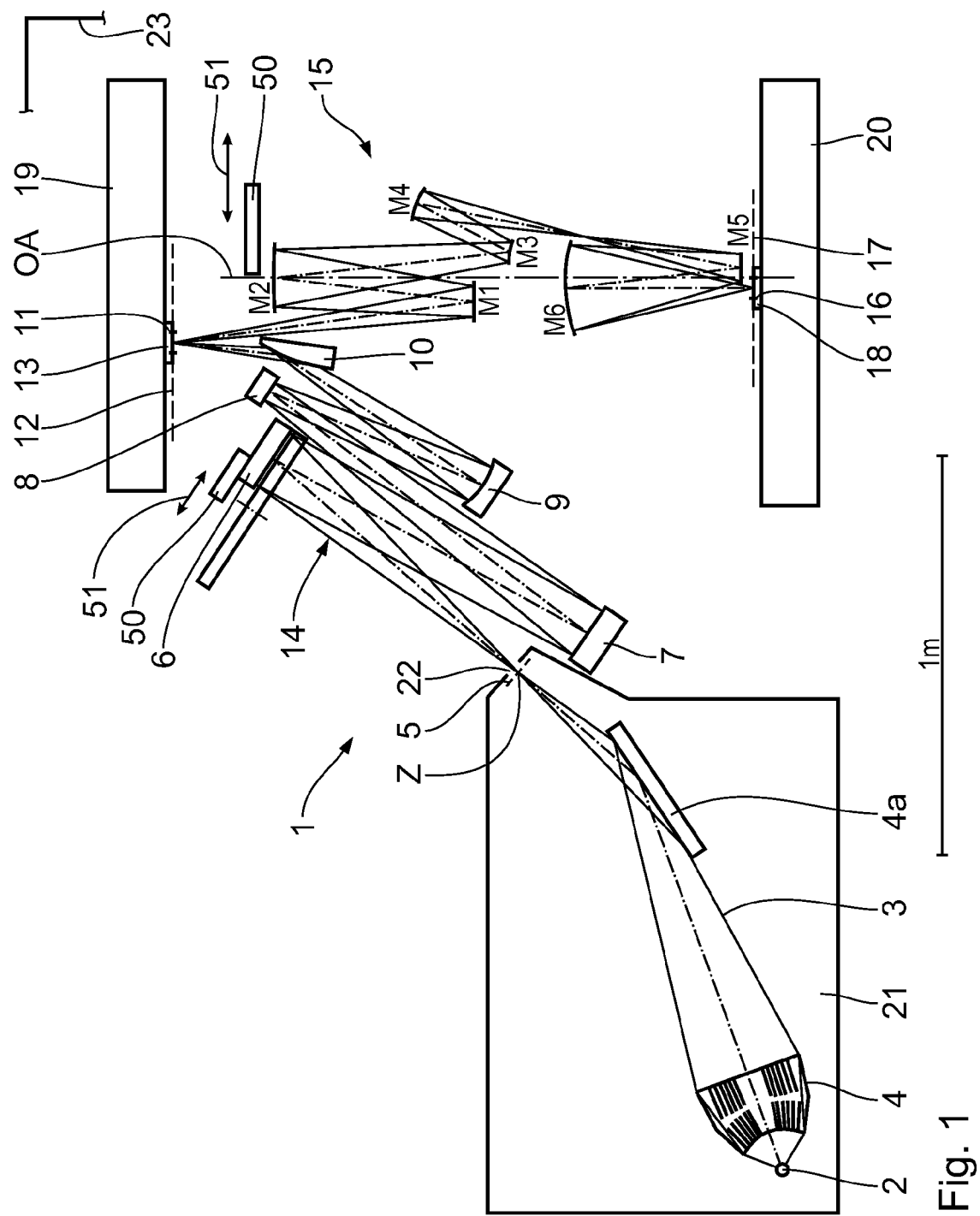
FIG. 1 schematically shows a projection exposure installation for EUV microlithography, an illumination optics and a projection optics being shown in meridional section.

FIG. 1 schematically shows a projection exposure installation 1 for EUV microlithography. The projection exposure installation 1 has an EUV radiation source 2 for producing a useful radiation beam bundle 3. The wavelength of the useful radiation beam bundle 3 is, in particular, between 5 nm and 30 nm. The EUV radiation source 2 may be an LPP source (laser-produced plasma) or a GDPP source (gas discharge-produced plasma). Alternatively, for example a DUV radiation source may also be used, which, for example produces a useful radiation beam bundle with a wavelength of 193 nm.

The useful radiation beam bundle 3 is collected by a collector 4. Corresponding collectors are known, for example, from EP 1 225 481 A, US 2003/0043455 A and WO 2005/015 314 A2. After the collector 4 and grazing reflection on a spectral filter 4a the useful radiation beam bundle 3 firstly propagates through an intermediate focus plane 5 with an intermediate focus Z and then impinges on a field facet mirror 6. After reflection on the field facet mirror 6, the useful radiation beam bundle 3 impinges on a pupil facet mirror 7.

After reflection on the pupil fact mirror 7, the useful radiation beam bundle 3 is firstly reflected on two further mirrors 8, 9. After the mirror 9, the useful radiation beam bundle 3 impinges on a grazing incidence mirror 10.

Together with the pupil facet mirror 7, the further mirrors 8 to 10 image field facets of the field facet mirror 6 in an object field 11 in an object plane 12 of the projection exposure installation 1. A surface portion to be imaged of a reflecting reticle 13 is arranged in the object field 11.

The mirrors 6 to 10, and in a further sense, also the collector 4, belong to an illumination optics 14 of the projection exposure installation 1.

A projection optics 15 images the object field 11 in an image field 16 in an image plane 17. A substrate 18 in the form of a wafer is arranged there. The reticle 13 and the wafer 18 are carried by a reticle holder 19 and a wafer holder 20. The pupil facet mirror 7 lies in an optical plane, which is optically conjugated to a pupil plane of the projection optics 15.

The object field 11 is arcuate, the meridional section of the illumination optics 14 shown in FIG. 1 running through axis of mirror symmetry of the object field 11. A typical extent of the object field 11 in the plane of the drawing of FIG. 1 is 8 mm. A typical extent of the object field 11 is 104 mm perpendicular to the plane of the drawing of FIG. 1. A rectangular object field, for example with a corresponding aspect ratio of 8 mm×104 mm is also possible.

The projection optics 15 is a mirror optics with six mirrors M1 to M6, which are numbered consecutively in FIG. 1 in the order of the imaging beam path of the projection optics 15 between the object field 11 and the image field 16 in the image plane 17. An optical axis OA of the projection optics 15 is indicated in FIG. 1. Each of the mirrors 6 to 10 of the illumination optics 14 and M1 to M6 of the projection optics 15 is an optical element with an optical surface which can be acted upon by the useful radiation beam bundle 3. The reticle 13 is also an optical element of this type.

The light source 2, the collector 4 and the spectral filter 4a are accommodated in a source chamber 21, which can be evacuated. The source chamber 21 has a through-opening 22, for the useful radiation beam bundle 3 in the region of the intermediate focus Z. Accordingly, the illumination optics 14 following the intermediate focus Z and the projection optics 15 and the reticle holder 19 and the wafer holder 20 are accommodated in an illumination/projection optics chamber 23, which can also be evacuated and of which only a wall portion in the region of a chamber corner is shown schematically in FIG. 1.

Figure 2:
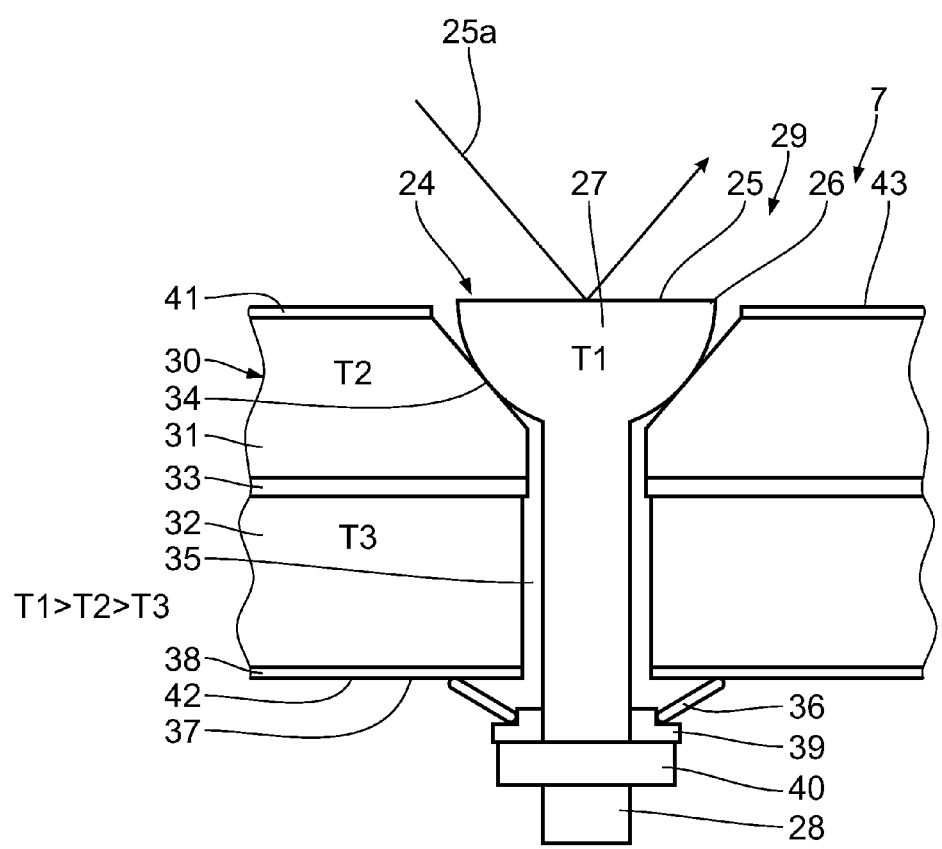
FIG. 2 shows in a broken cross section, a detail of an optical assembly in the form of a pupil facet mirror with a pupil facet as the mirror with a mirror body, which is carried by a support body with two support body portions.

FIG. 2 shows a detail of the pupil facet mirror 7 in the region of a pupil facet, in other words in the region of a mirror 24 with a facet reflection surface 25 for a part beam bundle 25a of the useful radiation beam bundle 3 and with a mirror body 26.

The structure of the pupil facet mirror 7 with the pupil facets or mirrors 24 is similar to the structure of a facet mirror, which is described in US 2005/0111067 A1, reference being made to the content thereof.

The mirror body 26 has a hemispheric dome portion 27. The reflection surface 25 lies in a plane, which runs through the centre point of the ball predetermined by the dome portion 27. A support rod portion 28 of the mirror body 26 adjoins an apex of the dome portion 27. The mirror body 26 is formed in one piece and, in the embodiment observed, is made of silicon.

A support body 30, which carries the mirror 24 and of which only that detail is shown in FIG. 2, which belongs to the mirror 24 shown, also belongs to the optical assembly 29 having the mirror 24 with the mirror body 26. More detail with regard to the arrangement of the large number of mirrors 24, which build up the pupil facet mirror, in the support body 30, can be inferred from US 2005/0111067 A1.

The support body 30 has a first support body portion 31, which is shown at the top of FIG. 2, and a second support body portion 32, which is shown at the bottom of FIG. 2. The support body portions 31, 32 are made of steel. Arranged between the two support body portions 31 and 32 is a layer 33, which is formed from a material thermally insulating the two support body portions 31, 32 from one another. The layer 33 may be a thermal block or sink. An evacuated volume may also be provided, instead of the layer 33, between the two support body portions 31, 32 for thermal insulation between them.

Adjacent to the reflection surface 25, the mirror body 26 rests via a first contact portion 34 extending circularly on the dome portion 27 on the first support body portion 31. The first contact portion 34 forms a first thermal contact of the mirror 24 with the support body 30.

The mirror body 26 is guided with the support rod portion 28 through a through-bore 35 through the support body 30. The through-bore 35 widens conically in the region of the dome portion 27. The first contact portion 34 is located in this conical widening region. On the side opposing the conical widening portion of the through-bore 35, the support rod portion 28 of the mirror body 26 is supported by a plate spring 36, which annularly surrounds the support rod portion 28, via an annular second contact portion 37 on the second support body portion 32. The second contact portion 37 is a second thermal contact of the mirror 24 with the support body 30. The second contact portion 37 is spaced further apart from the reflection surface 25 than the first contact portion 34.

On the support body side, the plate spring 36 is thus supported on a surface 38 of the second support body portion 32 shown at the bottom in FIG. 2.

On the opposing side, the plate spring 36 is supported via a washer 39 both on a nut 40, which is screwed onto an external thread, not shown in FIG. 2, of the support rod portion 28, and also on the support rod portion 28 itself. A prestressing of the plate spring 36 can be predetermined by the nut 40.

The mirror body 26 has a temperature T1. The first support body portion 31 has a temperature T2. The second support body portion 32 has a temperature T3. With a thermal loading of the reflection surface 25, in particular by residual absorption of the part beam bundle 25a, T1>T2>T3 generally applies.

The surface 38 of the second support body portion 32 and also a surface 41 surrounding the reflection surface 25 are modified surface portions of the support body portions 31, 32. The modification of the surface portions 38, 41 is such that a thermal emission coefficient $\epsilon_m$ of the respective modified surface portion 38, 41 differs from a thermal emission coefficient $\epsilon_u$ of another, unmodified surface portion of the respective support body portion 31, 32 by at least 10%. The surface modification of the surface portion 38 of the second support body portion 32 is a glass coating 42. The surface modification of the surface portion 41 of the first support body portion 31 is a microstructuring of the surface portion 41.

Via the surface modification of the surface portion 38, in other words by the glass coating 42, the thermal emission coefficient of the second support body portion 32 is reduced compared to the unmodified thermal emission coefficient.

The thermal emission coefficient of the surface portion 41 is increased in comparison to the unmodified surface of the first support body portion 31 by the surface modification of the surface portion 41, in other words by the microstructures 43.

Basically, the mirror body 26 may be displaceable relative to the support body 30 via an actuator, not shown in the drawings, for tilting the reflection surface 25. The surface portion modified to change the thermal emission coefficient may be configured as a portion of an actuator component of this actuator for the mirror body 26. A linear motor with a stator with a linear winding, which is fixed to the mirror body 26 or to the support body 30 and with an actuator pin entering the linear winding of the stator, which is fixed to the respective other component of the mirror 24, in other words to the support body 30 or to the mirror body 26, can be used as an actuator.

Figure 3:
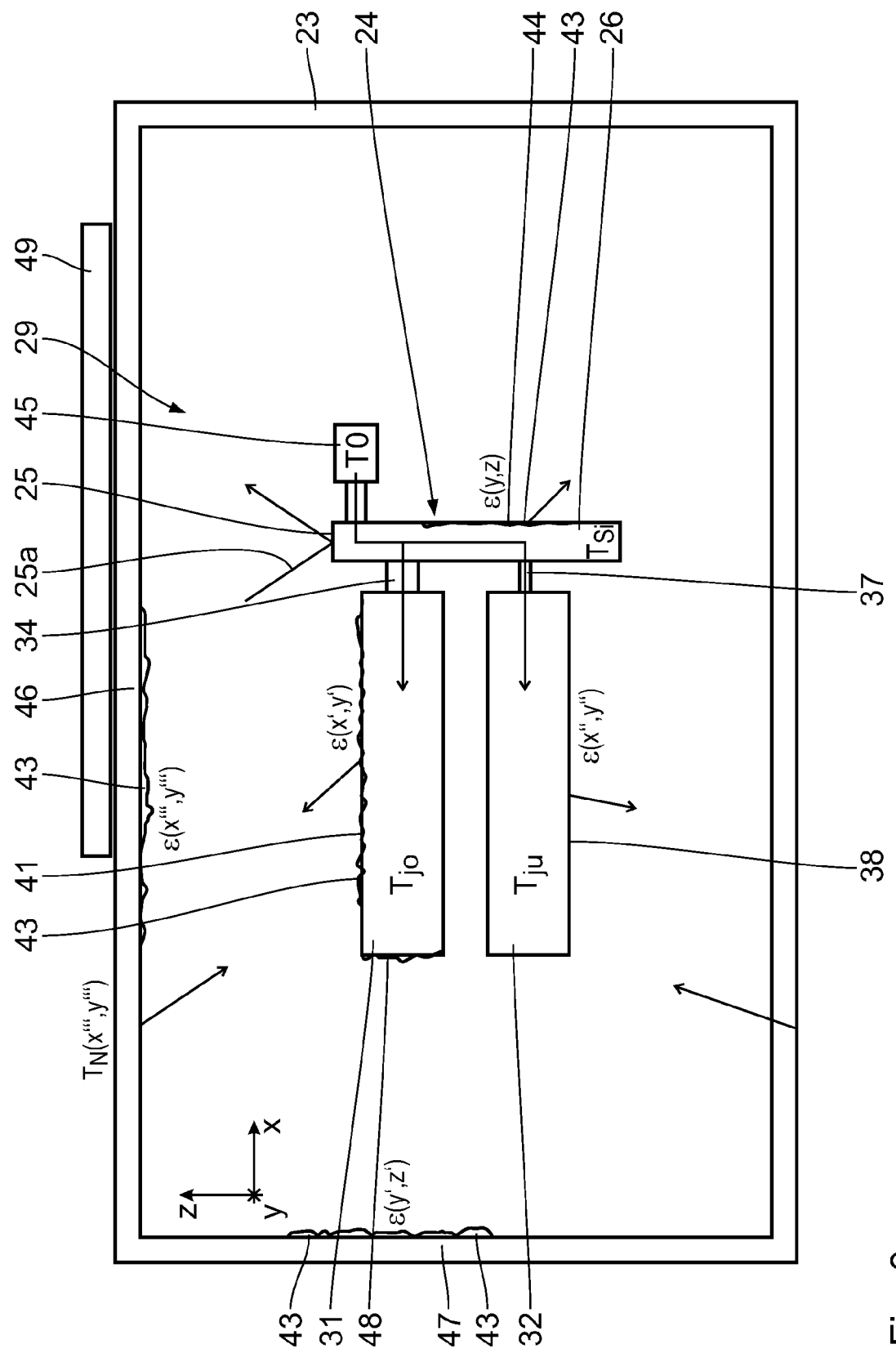
FIG. 3 schematically shows an arrangement of a mirror with a mirror body and a support body with two support body portions in a modified embodiment in comparison to FIG. 2 to show a heat balance.

FIG. 3, in comparison to FIG. 2, highly schematically shows a further embodiment of an optical assembly 29. Components, which correspond to those which have already been described above in relation to FIGS. 1 and 2, have the same reference numerals and will not be discussed again in detail.

If desired, a local Cartesian coordinate system of the respective optical assembly 29 is drawn in FIG. 3ff. In FIG. 3, the x-axis runs to the right. The y-axis runs perpendicular to the plane of the drawing and into it. The z-axis runs upward.

In the optical assembly 29 according to FIG. 3, the surface portion 41 of the first support body portion 31 adjacent to the mirror 24 is roughened, in other words carries microstructures 43. A locally varying thermal emission coefficient $\epsilon(x', y')$ results. The surface portion 38 of the second support body portion 32 has a thermal emission coefficient $\epsilon(x'', y'')$.

In addition, in the embodiment according to FIG. 3, a surface 44 of the mirror body 26 shown in FIG. 3 on the right is roughened in portions and carries microstructures 43 there, so a site-dependent thermal emission coefficient $\epsilon(y, z)$ is in turn produced.

A thermal residual absorption of the part beam bundle 25a is symbolised in FIG. 3 representing a heat balance by a heat resistor 45 with a temperature $T_O$, which is in thermal contact with the mirror body 26 in the region of the reflection surface 25.

The first support body portion 31 has a temperature of $T_{jo}$. The second support body portion 32 has a temperature of $T_{ju}$. The mirror body 26 has a temperature $T_{si}$.

A heat flow $dQ_{in}$ is introduced via the heat resistor 45 into the mirror body 26. The mirror body 26 emits a heat flow $dQ_{ju}$ via the first contact portion 34 to the first support body portion 31 and a heat flow $dQ_{jo}$ via the second contact portion 37 to the second support body portion 32.

The illumination/projection optical chamber 23, associated with the optical assembly 29, may also have microstructures 43 in surface portions 46, 47 (cf FIG. 3), so site-dependent thermal emission coefficients $\epsilon(x''', y''')$ or $\epsilon(y', z')$ are present there. The first support body portion 31, opposing the surface portion 47, has a further surface portion 48 modified by microstructuring with microstructures 43.

Outside the illumination/projection chamber 23, an active cooling device 49 may also be provided to cool or heat an environment outside the chamber 23. The temperature of the wall of the chamber 23 is also therefore site-dependent and may be modelled by a temperature field $T_M(x, y, z)$.

To calculate a heat balance, firstly the heat radiation of the various bodies of the optical assembly 29 over the surface thereof is observed, which is proportional to the fourth power of the temperature and the emission coefficient. There applies:

$$dT = 1/m/c * \sigma * \epsilon (T^4 - T_N^4) * dA * dt \qquad (1)$$

In this case:
dT is the temperature change of the respective body,
dA is the observed surface element,
dt is the observed time element,
T is the temperature of the observed body,
$T_N$ is the temperature of the surroundings,
m is the mass of the observed body,
c is the heat capacity of the observed body,
$\sigma$ is the Boltzmann constant
$\epsilon$ is the thermal emission coefficient of the observed body.

The value of the thermal emission coefficient $\epsilon$ depends on the nature of the respective surface of the observed body. The thermal emission coefficient $\epsilon$ varies for steel, for example, between 0.05 for polished surfaces through to 0.8 for rough or oxidised surfaces. Via a corresponding coating, for example via the glass coating 42, the thermal emission coefficient $\epsilon$ can be varied within a still greater range.

The heat flow dQ or $\Delta Q$ between the mirror body 26 and the two support body portions 31, 32 is proportional to the product of the heat transmission coefficient h and a contact face A of the respective contact portion 34, 37. The product of the heat transmission coefficient h and the contact face A is defined by the heat transmission equations:

$$\Delta Q_{jo} = (h*A)_{jo} * (T_{Si} - T_{jo}) * \Delta t \qquad (2)$$

$$\Delta Q_{ju} = (h*A)_{ju} * (T_{Si} - T_{ju}) * \Delta t \qquad (3)$$

Here:
$\Delta Q_{jo}$ is the heat flow toward the first support body portion 31,
$\Delta Q_{ju}$ is the heat flow toward the second support body portion 32,
$\Delta t$ is the observed time element.

Together with equation (1), the heat balance can be written as:

$$(h*A)_{source}*(T_O - T_{Si}) - (h*A)_{jo}*(T_{Si} - T_{jo}) - (h*A)_{ju}(T_{Si} - T_{ju}) - \sigma*\epsilon_{Si}*(T_{Si}^4 - T_{SN}^4)(O_{Si} = m_{Si}*c_{Si}*\Delta T_{Si}/\Delta t \qquad (4)$$

$$(h*A)_{jo}*(T_{Si} - T_{jo}) - \sigma*\epsilon_{steel}*(T_{jo}^4 - T_N^4)*O_{jo} = m_{jo}*C_{jo}*\Delta T_{jo}/\Delta t \qquad (5)$$

$$(h*A)_{ju}*(T_{Si} - T_{ju}) - \sigma*\epsilon_{steel}*(T_{ju}^4 - T_N^4)*O_{ju} = m_{ju}*C_{ju}*\Delta T_{ju}/\Delta t \qquad (6)$$

Here:
A is the respective contact face,
O is the respective surface,
the Index "source" designates the heat source, in the example observed, in other words, the heat resistor element 45.

Figure 4:
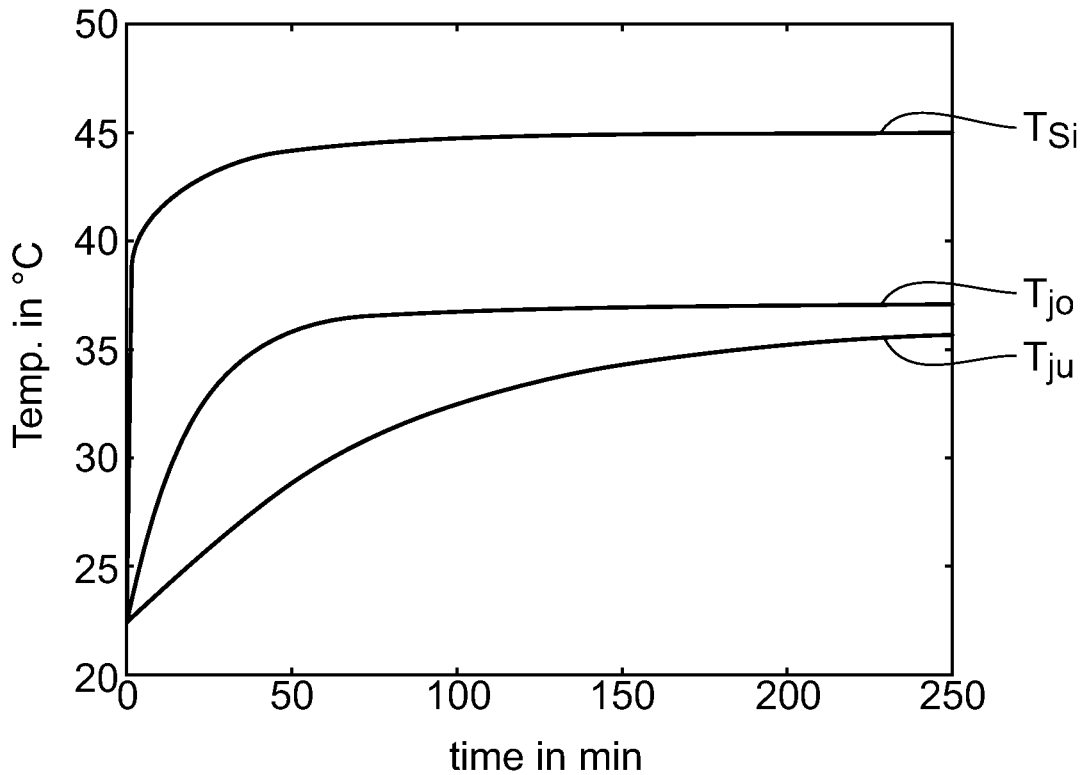
FIG. 4 shows in a graph, a time course of instantaneous temperatures of the mirror body and the two support body portions after the beginning of a useful light impingement of the mirror with useful light.

FIG. 4 shows the thermal course of the temperatures $T_{Si}$ of the mirror bodies 26, $T_{jo}$ of the first support body portion 31 and $T_{ju}$ of the second support body portion 32, in which at the beginning of the time measurement, a thermal load was added. The following load case was calculated:

$m_{jo}$=0.13 kg $O_{jo}$=0.005 m²$c_{jo}$=c(steel)=477 J/kg/K $m_{ju}$=0.14 kg $O_{ju}$=0.007 m²$c_{ju}$=c(steel)=477 J/kg/K $m_{Si}$=0.007 kg $O_{Si}$=0.001 m²$c_{Si}$=c(silicon)=700 J/kg/K $(h*A)_{jo}$=0.05 J/K/sec $(h*A)_{ju}$=0.01 J/K/sec $\epsilon_{Si}$=0.2

$\epsilon_{steel, top}$=0.15*5.5 (thermal emission coefficient in the surface portion 41 because of the microstructuring 43)

$\epsilon_{steel, bottom}$=0.15 (unstructured surface 38 of the second support body portion 32)

As a result, (cf FIG. 4) a temperature course is produced, in which after about 3 hours, the temperatures $T_{jo}$, $T_{ju}$ of the two support body portions 31, 32 have equalised except for about 1K. A thermal delay of the support body 30 is then minimal. An impairment of an image-guiding effect of the pupil facet mirror 7 is then minimal.

A modification of the surface portions 38, 41, 44 and 46 to 48 mentioned above may also be produced, as an alternative to a microstructuring, by the application of diffractive structures, which are matched to the wavelength of a radiation to be reflected by the mirror 24. Instead of microstructures 43, the modified surface portions 38, 41, 44 and 46 to 48 may also have nanostructures or mm- or cm-structures, for example notches or holes, in particular blind holes. The processed surface portions 38, 41, 44 and 46 to 48 may also have a surface layer, which differs with respect to its chemical composition from bodies 26, 31, 32 located therebelow. An oxide layer, a varnish or a glass coating, as already described above is possible, for example, as a surface layer. A coating with other extraneous substances is also possible.

Figure 5:
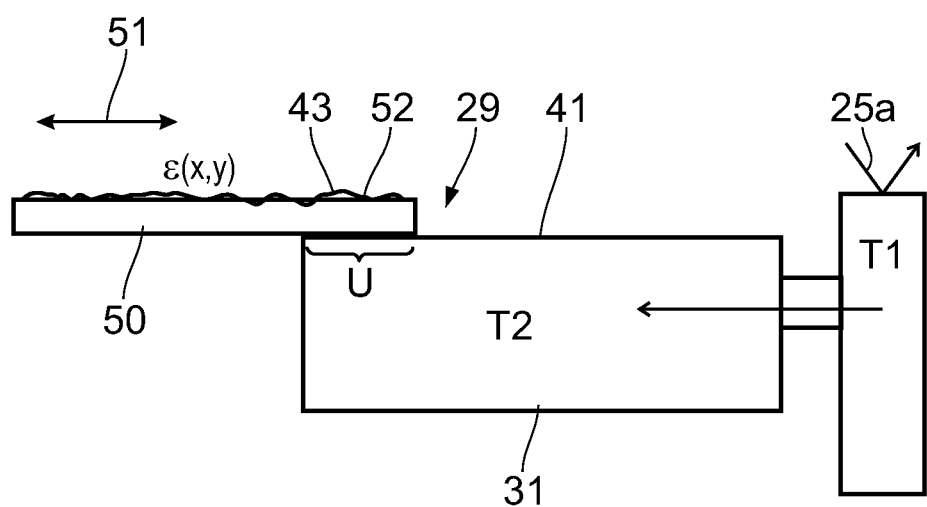
FIGS. 5 to 7 show partially in a broken view and highly schematically, further embodiments of optical assemblies.

FIG. 5, in a detail, shows a further variant of an optical assembly 29. Components which correspond to those which have already been described above with reference to FIGS. 1 to 4 have the same reference numerals and will not be discussed again in detail.

In the optical assembly 29 according to FIG. 5, the surface 41 of the first support body portion 31 also has a modified surface portion. This is in thermal contact with a covering body 50 which can be displaced relative to the first support body portion 31. The covering body 50 can be displaced manually or with the aid of a drive not shown in FIG. 5 along a displacement direction (cf 51 in FIG. 5). The covering body 50 has a surface 52 remote from the first support body portion 31 with microstructures 43 and a locally varying thermal emission coefficient $\epsilon(x, y)$.

The heat flow between the first support body portion 31 and the covering body 50 can be predetermined by the size of a covering face U and therefore a heat dissipation from the first support body portion 31 varied such that, depending on a temperature T1 of the mirror body 26, the temperature T2 of the first support body portion 31 becomes equal to a temperature of the second support body portion 32 not shown in FIG. 5.

With the aid of FIG. 6, a further embodiment of an optical assembly 29 will be described below. Components which correspond to those which have already been described above with reference to FIGS. 1 to 5, have the same reference numerals and will not be discussed again in detail.

Figure 6:
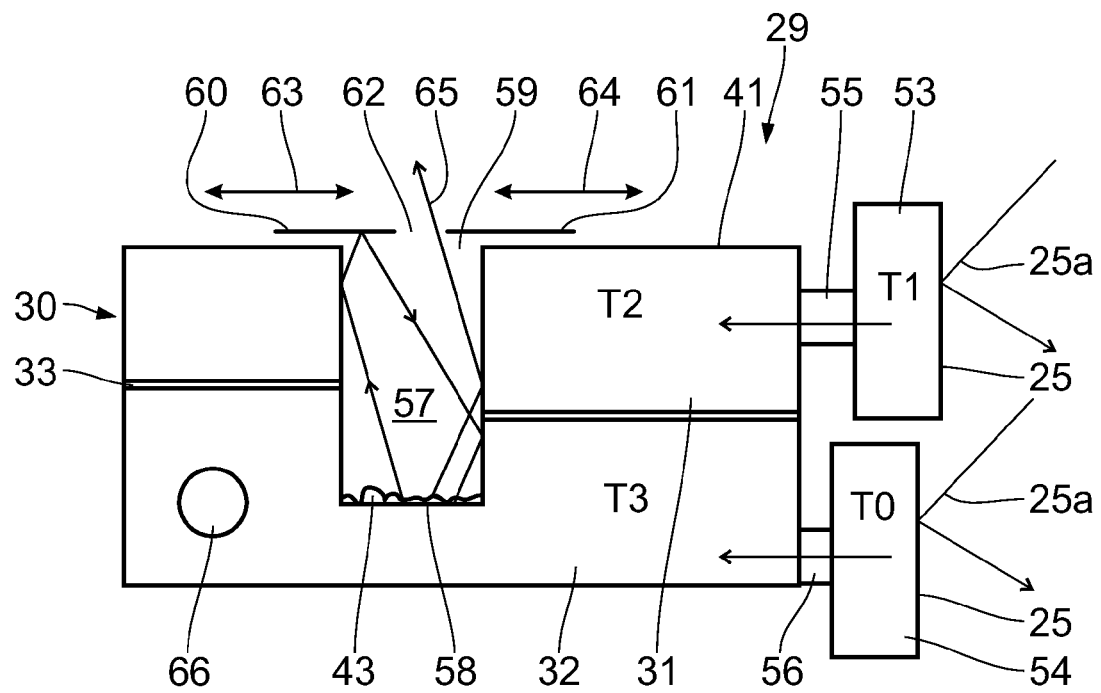

In the embodiment according to FIG. 6, instead of a mirror, which rests via two contact portions on the two support body portions 31, 32 of the support body, two mirrors 53, 54 are provided.

The first mirror 53 shown at the top in FIG. 6 has a reflection surface 25 and, opposing this, a contact portion 55, via which the first mirror 53 rests on the first support body portion 31 and is in heat contact therewith.

The second mirror 54 shown at the bottom in FIG. 6 has a reflection surface 25 and, opposing this, a contact portion 56, via which the second mirror 54 rests on the second support body portion 32 and is in heat contact therewith.

The surface 41 of the first support body portion 31 is processed in one portion. In the processed portion, a blind hole or pocket structure 57 in the form of a blind hole is present, which completely penetrates the first support body portion 31 and the layer 33 for thermal separation between the support body portions 31, 32. A base 58 of the pocket structure 57 is configured in the core of the second support body portion 32 and is processed in such a way that it has microstructures 43. The pocket structure 57 opens via a pocket opening 59 into the surroundings of the support body 30.

To close the pocket opening 59, two lid bodies 60, 61 are used, which can both be displaced independently of one another to close the pocket opening 59 with a predetermined opening width 62 (cf double arrows 63, 64). The lid bodies 60, 61 can in turn be displaced either manually or with the aid of a drive, not shown.

Depending on the size of the opening width 62 adjusted by the two lid bodies 60, 61, a thermal radiation 65, proceeding from the base 58, is effective to a different degree to cool the two support body portions 31, 32. A heat flow from the microstructured base 58 to the outside is all the greater, the greater the opening width 62.

The ratio of the heat flow fractions of the two support body portions 31, 32 to the heat transported as a whole via the pocket structure 57 through the opening width 62 can be predetermined by the depth of the pocket structure 57 and the microstructuring 58. Accordingly, the temperatures T0, T1 of the two mirrors 53, 54 can be equalised with one another if desired.

The second support body portion 32 in the embodiment according to FIG. 6, has an active temperature-control device in the form of an active cooling device 66. This is formed by a cooling channel in the second support body portion 32, which is shown in cross section in FIG. 6 and is configured to guide a heat carrier fluid, for example to guide cooling water.

A further embodiment of an optical assembly 29 is described below with the aid of FIG. 7. Components which correspond to those which have already been discussed with reference to FIGS. 1 to 6, have the same reference numerals and will not be described again in detail.

Figure 7:
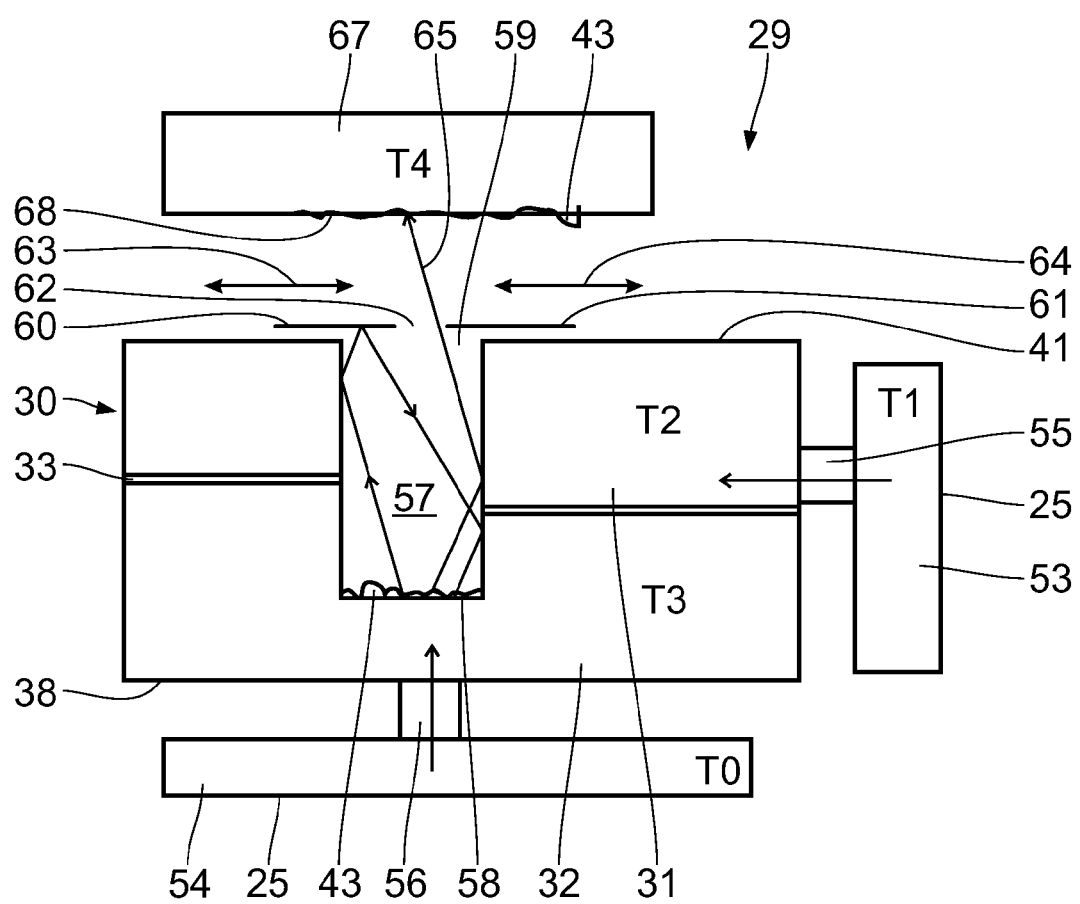

In the embodiment according to FIG. 7, the mirror 54 does not rest, as in the embodiment according to FIG. 6, on a side wall of the second support body portion 32, but on its surface 38 shown at the bottom in FIG. 7 via the contact portion 56. In the embodiment according to FIG. 7, the reflection surface 25 of the mirror 53 points to the right and the reflection surface 25 of the mirror 54 points downward.

Arranged opposing the pocket opening 59 of the pocket structure 57 in the embodiment according to FIG. 7 is a thermal radiation body 67 with a surface portion 68 having microstructures 43 and facing the support body 30. The radiation body 67 is held at a defined temperature T4, so a defined heat radiation flow results between the support body 30 and the radiation body 67, in particular between the radiation body 67 and the support body portion 31 facing it and having the pocket opening 59.

Figure 8:
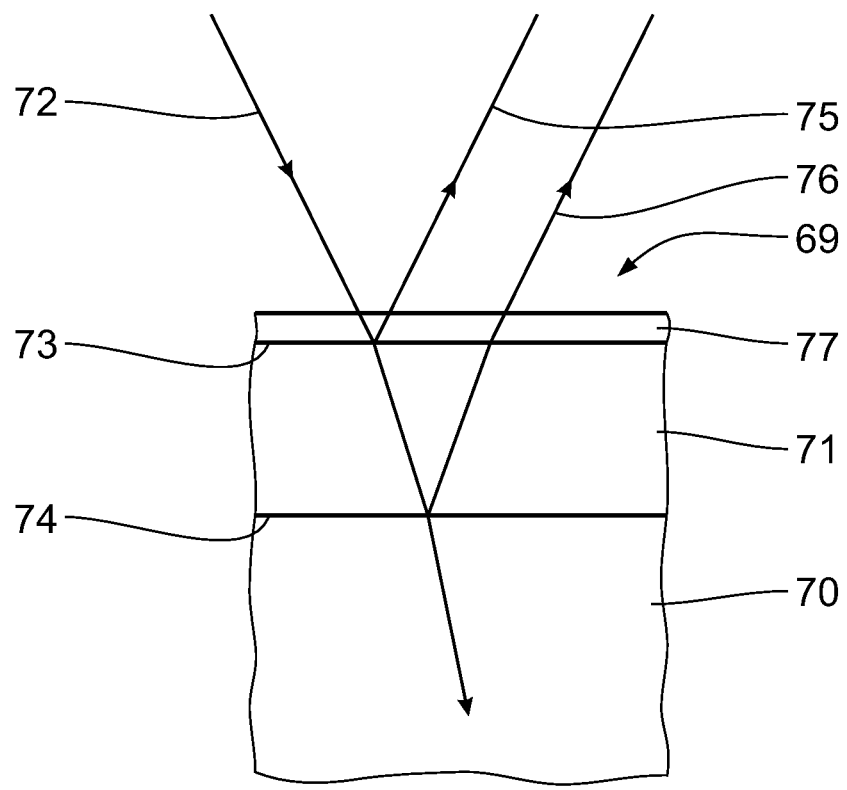
FIG. 8 shows, highly enlarged and schematically, a section through a detail of a body with a surface portion which has been modified by the application of an anti-reflex-interference coating with regard to its thermal emission coefficient.

FIG. 8 shows a further embodiment of a modified surface portion 69, which can be used instead of the modified surface portions described above to change the thermal emission coefficient of the otherwise unmodified surface. Components which, in the following description of the embodiment according to FIG. 8 correspond to those which have already been described above with reference to FIGS. 1 to 7 have the same reference numerals and will not be described again in detail.

A base body 70, which may, for example, be one of the support body portions 31, 32 or else the mirror body 26 and a structural part of an actuator or a component of an actuator for displacing the mirror body 26, or the thermal radiation body 67, is provided with a coating 71. The coating 71 is a coating, which is designed for a wavelength of thermal radiation, which is a maximum of a thermal emission at an operating temperature of the optical assembly 29, to which the surface portion 69 belongs. The coating 71 may, for example, be configured for an infrared radiation emitted from the base body 70 in the range of 10 µm. The coating 71 can be designed as an anti-reflex interference coating made of a dielectric material. Another configuration wavelength in the range of, for example between 2.5 µm and 15 µm, for example 3 µm is also possible. An incident heat beam 72 may penetrate the coating 71 practically without loss. This does not only apply to the incident heat beam 72, but conversely also to the heat radiation of the configured wavelength, which is radiated outwardly from the base body 70. The coating 71 is designed as a lambda/quarter layer. The layer thickness of the coating 71 is, in other words, such that heat part beams 75, 76 reflected on the coating interfaces 73, 74 interfere with one another destructively.

The coating 71 in turn carries a thin absorbing metal layer 77, for example a chromium layer. The coating 71 at a working temperature of the base body 70 of about 330° C. has a layer thickness of about 3 µm.

The surface portion 69 has a thermal emission coefficient, which is only slightly less than 1, for the working temperature.

Instead of a dielectric single layer system as in the embodiment according to FIG. 8, a surface portion can also be modified by applying a dielectric multi-layer system. As a result, an anti-reflex interference coating can be provided for a greater wavelength range by a maximum of a thermal emission at a working temperature of the respective base body. The multi-layer system may have two dielectric layers, three dielectric layers, four dielectric layers, five dielectric layers or else more dielectric layers, for example ten dielectric layers or an even larger number of dielectric layers.

Figure 9:
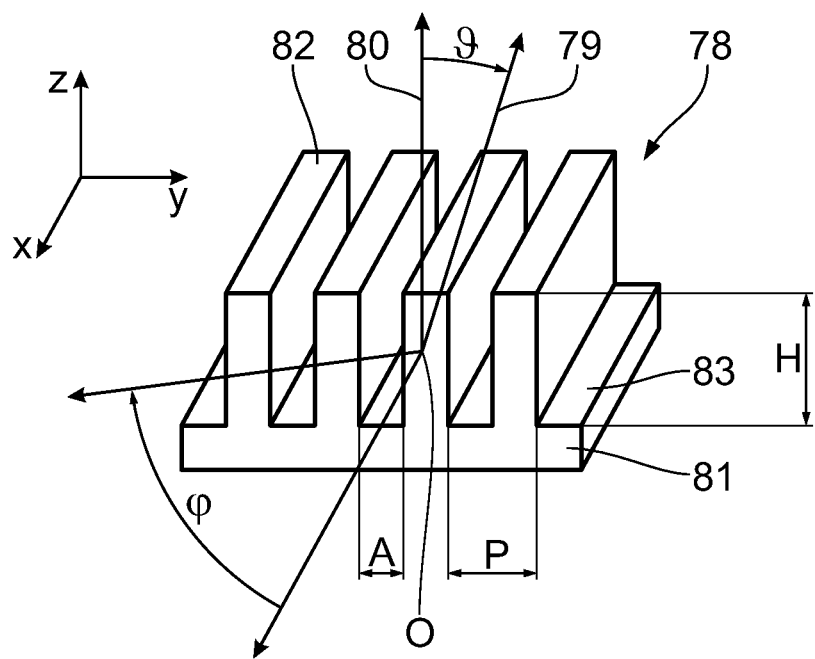
FIG. 9 also shows in a highly enlarged, perspective and schematic manner, a surface portion modified by microstructuring.

FIG. 9 shows a further embodiment of a modified surface portion 78, which can be used instead of the above-described modified surface portions to change the thermal emission coefficient of the otherwise unmodified surface. Components which in the following description of the embodiment according to FIG. 9 correspond to those which have already been described above with reference to FIGS. 1 to 8, have the same reference numerals and are not described again in detail.

The surface portion 78 is modified in such a way that a thermal emission that is anisotropic with respect to its direction from the modified surface portion 78 results. An outstanding heat beam 79 emitted from the surface portion 78 is shown in FIG. 9. The direction of the heat beam 79, proceeding from a normal vector 80 of the surface portion 78 can be given via polar angles θ, φ, proceeding from an origin O in FIG. 9.

The surface portion 78 has rib structures extending from a base body 81 in the form of microribs 82. Each of the microribs 82 has a height extent H over an upper side 83 of the base body 81 of 20 µm. Adjacent ones of the microribs 82 follow one another at a period P of about 10 µm. A spacing A of about 5 µm is present between two adjacent ones of the microribs 82. The spacing A may be in a range of between 3 µm and 7 µm.

To illustrate position relationships, a Cartesian xyz-coordinates system is drawn in FIG. 9. The upper side 83 extends parallel to the xyz-plane. The normal vector 80 extends parallel to the z-axis.

The origin O lies in the xy-plane. The angle θ is measured here proceeding from the normal vector 80. The angle φ is measured in the xy-plane proceeding from the x-axis.

Depending on the operating temperature of the base body 81, for which the thermal emission from this is to be maximised by the microribs 82, the microribs have a height H in the range between 0.5 µm and 100 µm. The spacing A may, depending on the operating temperature or design temperature, vary in the range between 0.5 µm and 50 µm. The period P may vary in the range of between 1 µm and 100 µm.

A rib cross section of the microribs 82 may, as shown in FIG. 9, be rectangular. A saw tooth cross section, a triangular cross section, a trapezoidal cross section or a continuously extending cross section, in other words, a cross section approaching a sinusoidal function of the microribs 82 is possible. In addition it is possible to configure the cross section of the microribs 82 in such a way that the rib thickness is constant over a large part of the height extent H of the microribs 82 and upper end faces of the microribs 28 are rounded.

The microribs 82 applied to the base body 81 lead to the increase of a thermal emission coefficient of the base body 81 from an unmodified value of, for example, 0.4 in a base body 81 having no microribs to a thermal emission coefficient of, for example, 0.7 or 0.8. Because of the course of the rib structures 82 along the x-direction, a preferred direction or a preferred plane of the thermal emission in the radiation directions is produced with φ in the range around 0° and in the range around 180°. With these radiation directions (0°≤θ≤90°), no shading effect of the microribs 82 is produced for the radiated heat radiation. In the case of radiation directions like the direction of the heat beam 79 with φ in the region around 90° or in the region around 270°, above an angle θ of for example 45°, in other words in the case of flat radiation angles perpendicular to the microribs 82, a substantial part of the heat radiation is shaded by the rib structures 82.

This anisotropy of the thermal emission of the unmodified surface portion 78 can be used to direct the heat radiation emitted by the surface portion 78 in a targeted manner, for example to another heat-dissipating body, for example to the radiation body 67 of the configuration according to FIG. 7.

The surface portions 69 and/or 78 of the configuration in FIGS. 8 and 9 may be other surface portions of the mirror body 26, in other words surface portions thereof with the exception of the reflection surface 25, or surface portions of the support body 30.

Various variants of the optical assemblies described above with the aid of FIGS. 2 to 7 are indicated in FIG. 1. The mirrors 6, 7, 8, 9, 10, M1, M2, M4 and M6 are configured with mirror bodies or support bodies with surface portions modified according to the above. The mirrors 6 and M2 also in each case have a covering body 50 in accordance with the configuration according to FIG. 5.

What is claimed is:
1. An optical assembly, comprising:
a mirror having a mirror body;
a support body carrying the mirror body, the support body having a first body portion, a second support body portion, and an at least partially thermally separating region between the first and second support body portions, wherein:
a member of the optical assembly has a modified surface portion and an unmodified surface portion;
the member is selected from the group consisting of the first support body portion, and a body thermally coupled to the first support body portion; and
the modified surface portion has a thermal emission coefficient $\epsilon_m$ which differs from a thermal emission coefficient $\epsilon_u$ of the unmodified surface portion by at least 10 percent.

2. The optical assembly of claim 1, wherein the modified surface portion has microstructures.

3. The optical assembly of claim 1, wherein the modified surface portion has diffractive structures which are matched to a wavelength of radiation to be reflected by the mirror during use of the optical assembly.

4. The optical assembly of claim 1, wherein the modified surface portion has nanostructures.

5. The optical assembly of claim 1, wherein the modified surface portion has millimeter structures or centimeter structures.

6. The optical assembly of claim 1, wherein the modified surface portion comprises a surface layer having a chemical composition that is different from a chemical composition of the support body.

7. The optical assembly of claim 1, further comprising a covering body in thermal contact with the modified surface portion, wherein the covering body is displaceable relative to the first support body portion so that the thermal emission coefficient $\epsilon_m$ of the modified surface portion is dependent on the position of the covering body relative to the first support body portion.

8. The optical assembly of claim 7, wherein the covering body has a surface portion modified to change its thermal emission coefficient.

9. The optical assembly of claim 1, wherein:
the first support body portion has a modified surface portion that is modified so that a thermal emission coefficient $\epsilon_{m1}$ of the modified surface portion of the first support body differs from a thermal emission coefficient $\epsilon_{u1}$ of an unmodified surface portion of the first support body by at least 10 percent; and
the second support body portion has a modified surface portion that is modified so that a thermal emission coefficient $\epsilon_{m2}$ of the modified surface portion of the second support body differs from a thermal emission coefficient $\epsilon_{u2}$ of an unmodified surface portion of the second support body by at least 10 percent.

10. The optical assembly of claim 9, wherein $\epsilon_{m1}$ differs from $\epsilon_{m2}$ by at least 10 percent.

11. The optical assembly of claim 1, further comprising a thermal radiation body configured to have a predetermined heat radiation flow to another body of the optical assembly.

12. The optical assembly of claim 11, wherein the thermal radiation body has a surface portion modified to change its thermal emission coefficient.

13. The optical assembly of claim 1, wherein:
the mirror has a reflection surface;
the mirror body is supported by a contact portion of the first body portion;
the mirror body is supported by a contact portion of the second body portion;
the contact portion of the first body portion is a first distance from the reflection surface of the mirror; and
the contact portion of the second body is a second distance from the reflection surface of the mirror; and
the second distance is greater than the first distance.

14. The optical assembly of claim 1, wherein the mirror comprises first and second mirrors, the first mirror is supported by the first support body portion, and the second mirror is supported by the second support body portion.

15. The optical assembly of claim 1, wherein the modified surface portion has an opening which completely passes through the first support body portion and the at least partially thermally separating region into a surrounding region of the support body.

16. The optical assembly of claim 15, further comprising a lid body which is displaceably configured to close the pocket opening with a predetermined opening width.

17. The optical assembly of claim 15, further comprising a thermal radiation body with a predetermined heat radiation flow to the support body portion, wherein the thermal radiation body is arranged opposing the opening of the modified surface region.

18. The optical assembly of claim 1, further comprising an active temperature control device configured to influence a temperature of at least one of the first and second support body portions.

19. The optical assembly of claim 18, wherein the active temperature control device is configured to influence the temperature via a heat carrier fluid.

20. The optical assembly of claim 19, wherein the active temperature control device has a temperature control channel in one of the first and second support body portions to guide the heat carrier fluid.

21. The optical assembly of claim 1, wherein the modified surface portion comprises a coating for a wavelength corresponding to a maximum of a thermal emission at an operating temperature of the optical assembly.

22. The optical assembly of claim 1, wherein the modified surface portion is configured so that a thermal emission results during use of the optical assembly, and the thermal emission is anisotropic with respect to its direction.

23. An illumination optics comprising an optical assembly according to claim 1.

24. A projection optics comprising an assembly according to claim 1.

25. A projection exposure installation, comprising:
an illumination optics configured to illuminate an object field in an object plane; and
a projection optics configured to image the object field into an image field in an image plane,
wherein the projection exposure installation comprises an optical assembly according to claim 1.

26. A method, comprising:
providing a projection exposure installation; and
using the projection exposure installation to project at least part of reticle onto a region of light-sensitive material supported by a wafer,
wherein the projection exposure installation comprises:
an illumination optics configured to illuminate an object field in an object plane; and
a projection optics configured to image the object field into an image field in an image plane, and
wherein the projection exposure installation comprises an optical assembly according to claim 1.

27. An optical system having an object field, the optical system comprising:
an optical assembly, comprising:
a mirror having a mirror body comprising:
a reflection useful surface; and
an additional surface portion, wherein:
the additional surface portion has a thermal emission coefficient which differs from a thermal emission coefficient of an unmodified surface portion of the mirror by at least 10%;
one of the following holds:
A) the optical system is an illumination optics configured to illuminate the object field, and the mirror is upstream of the object field along a path of radiation through the illumination optics to the object field; or
B) the optical system is a projection optics configured to image the object field into an image field, and the mirror is downstream of the object field along a path of radiation through the projection optics.

28. The optical system of claim 27, wherein the additional surface comprises a plurality of ribs which extend outwardly relative to the reflection useful surface.

29. The optical system of claim 27, wherein the additional surface portion comprises a metal.

30. The optical system of claim 29, wherein the additional surface portion comprises chromium.

31. The optical system of claim 27, wherein the additional surface portion comprises a dielectric layer.

32. The optical system of claim 27, wherein the additional surface portion comprises multiple dielectric materials configured in a multi-layer structure.

33. A projection exposure installation, comprising:
an illumination optics configured to illuminate an object field in an object plane; and
a projection optics configured to image the object field into an image field in an image plane,
wherein the projection exposure installation comprises an optical system according to claim 27.

34. An optical assembly, comprising:
a mirror having a mirror body comprising:
a reflection useful surface; and
an additional surface portion comprising a plurality of ribs which extend outwardly relative to the reflection useful surface,
wherein the additional surface portion has a thermal emission coefficient which differs from a thermal emission coefficient of an unmodified surface portion of the mirror by at least 10%.

35. The optical assembly of claim 34, wherein adjacent ribs are spaced between 0.5 µm and 50 µm from each other.

36. The optical assembly of claim 34, wherein the ribs the plurality of ribs are spaced in a pattern having a period of between 1 µm and 100 µm.

37. The optical assembly of claim 34, wherein, for at least some of the ribs, each rib has a height of between 0.5 µm and 100 µm.

38. The optical assembly of claim 34, wherein the plurality of ribs have a cross section selected from the group consisting of a saw tooth cross section, a triangular cross section, a trapezoidal cross section and a sinusoidal cross section.

39. The optical assembly of claim 34, wherein the thermal coefficient of the additional surface portion is from 0.7 to 0.8.

40. An illumination optics comprising an optical assembly according to claim 34.

41. A projection optics comprising an assembly according to claim 34.

42. A projection exposure installation, comprising:
an illumination optics configured to illuminate an object field in an object plane; and
a projection optics configured to image the object field into an image field in an image plane,
wherein the projection exposure installation comprises an optical assembly according to claim 34.

* * * * *

UNITED STATES PATENT AND TRADEMARK OFFICE
CERTIFICATE OF CORRECTION

PATENT NO. : 8,964,162 B2  Page 1 of 1
APPLICATION NO. : 13/235750
DATED : February 24, 2015
INVENTOR(S) : Damian Fiolka and Wilfried Clauss It is certified that error appears in the above-identified patent and that said Letters Patent is hereby corrected as shown below:

In the Specification

Col. 8, line 48, delete " $(h^*A)_{source}*(T_O-T_{Si})-(h^*A)_{jo}*(T_{Si}-T_{jo})-(h^*A)_{ju}(T_{Si}-T_{ju})-\sigma^*\epsilon_{Si}*-(T_{Si}^4-T_{SN}^4)(O_{Si}=m_{Si}*c_{Si}*\Delta T_{Si}/\Delta t$ ,, and insert -- $(h^*A)_{source}*(T_O - T_{Si}) - (h^*A)_{jo}*(T_{Si} - T_{jo}) - (h^*A)_{ju}(T_{Si} - T_{ju}) - \sigma^*\epsilon_{Si}*-(T_{Si}^4-T_{SN}^4)*O_{Si} = m_{Si}*c_{Si}*\Delta T_{Si}/\Delta t$ --.

Signed and Sealed this
Eighteenth Day of August, 2015

Michelle K. Lee
*Director of the United States Patent and Trademark Office*